(12) United States Patent
Ziglioli

(10) Patent No.: US 10,756,005 B2
(45) Date of Patent: Aug. 25, 2020

(54) SEMICONDUCTOR DEVICE, CORRESPONDING CIRCUIT AND METHOD

(71) Applicant: STMICROELECTRONICS S.R.L., Agrate Brianza (IT)

(72) Inventor: Federico Giovanni Ziglioli, Pozzo d'Adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/974,456

(22) Filed: May 8, 2018

(65) Prior Publication Data
US 2018/0342441 A1    Nov. 29, 2018

(30) Foreign Application Priority Data

May 23, 2017    (IT) .................. 102017000055921

(51) Int. Cl.
| H01L 23/495 | (2006.01) |
| H01L 21/56 | (2006.01) |
| H01L 23/31 | (2006.01) |
| H01L 23/00 | (2006.01) |

(52) U.S. Cl.
CPC .......... *H01L 23/4951* (2013.01); *H01L 21/56* (2013.01); *H01L 23/3107* (2013.01); *H01L 23/3157* (2013.01); *H01L 23/49517* (2013.01); *H01L 23/49548* (2013.01); *H01L 24/08* (2013.01); *H01L 23/49555* (2013.01); *H01L 23/49562* (2013.01); *H01L 2224/32145* (2013.01); *H01L 2224/32245* (2013.01); *H01L 2224/48091* (2013.01); *H01L 2224/48137* (2013.01); *H01L 2224/48145* (2013.01); *H01L 2224/48247* (2013.01); *H01L 2224/73227* (2013.01); *H01L 2224/73265* (2013.01); *H01L 2924/1815* (2013.01)

(58) Field of Classification Search
None
See application file for complete search history.

(56) References Cited

U.S. PATENT DOCUMENTS

| 5,841,193 | A | * | 11/1998 | Eichelberger | ....... H01L 23/5389 |
| | | | | | 257/723 |
| 5,977,626 | A | * | 11/1999 | Wang | .................. H01L 23/3128 |
| | | | | | 257/691 |
| 6,580,167 | B1 | * | 6/2003 | Glenn | ................ H01L 23/3128 |
| | | | | | 257/706 |
| 7,598,603 | B2 | * | 10/2009 | Otremba | ............. H01L 23/4334 |
| | | | | | 257/666 |
| 7,619,303 | B2 | * | 11/2009 | Bayan | ............... H01L 23/49541 |
| | | | | | 257/666 |
| 7,859,118 | B2 | * | 12/2010 | Tsai | .................. H01L 23/49833 |
| | | | | | 257/693 |

(Continued)

FOREIGN PATENT DOCUMENTS

| EP | 1211721 A1 | 6/2002 |
| EP | 2680306 A1 | 1/2014 |

*Primary Examiner* — Andres Munoz
(74) *Attorney, Agent, or Firm* — Seed Intellectual Property Law Group LLP

(57) ABSTRACT

A semiconductor device including one or more semiconductor dice, a lead frame including an array of signal-carrying leads electrically coupled with the semiconductor die, and a power supply connection for the at least one semiconductor die arranged centrally thereof.

17 Claims, 4 Drawing Sheets

(56) References Cited

U.S. PATENT DOCUMENTS

| | | | |
|---|---|---|---|
| 7,868,445 B2 * | 1/2011 | Kohl | H01L 21/6835 |
| | | | 257/690 |
| 7,977,163 B1 * | 7/2011 | Huemoeller | H01L 21/561 |
| | | | 257/773 |
| 8,362,607 B2 * | 1/2013 | Scheid | H01L 23/3675 |
| | | | 257/707 |
| 8,470,644 B2 * | 6/2013 | Yu | H01L 23/3107 |
| | | | 257/675 |
| 8,790,964 B2 | 7/2014 | Ding | |
| 8,803,299 B2 * | 8/2014 | Ong | H01L 23/3114 |
| | | | 257/676 |
| 9,129,930 B2 * | 9/2015 | Ding | H01L 23/49562 |
| 9,287,227 B2 * | 3/2016 | Luan | H01L 24/85 |
| 2002/0070464 A1 | 6/2002 | Frezza | |
| 2007/0296077 A1 | 12/2007 | Moline | |
| 2010/0078784 A1 | 4/2010 | Otremba | |
| 2014/0353816 A1 * | 12/2014 | Yap | H01L 23/3735 |
| | | | 257/713 |
| 2016/0372432 A1 * | 12/2016 | Tan | H01L 21/56 |

\* cited by examiner

SEMICONDUCTOR DEVICE, CORRESPONDING CIRCUIT AND METHOD

BACKGROUND

Technical Field

The description relates to semiconductor products or packages.

One or more embodiments may be applied to semiconductor products, such as e.g. integrated circuits.

Description of the Related Art

Conventional semiconductor products, such as, e.g., integrated circuits (for instance of the Quad Flat Package or QFP type), include a semiconductor die or a chip with an associated lead frame including electrical contact leads extending from a package. The leads in the lead frame provide signal transfer to and from the die or chip as well as power supply to the die or chip.

Such a basic configuration may contemplate a wide variety of variants. By way of example, EP 1 211 721 A1, which also published as U.S. Pat. Pub. No. 2002070464, discloses a plastic protective package for a semiconductor-integrated electronic device comprising a support having an electronic circuit place thereon. The circuit is adapted to be activated from outside the protective package. The protective package is provided with a hole or window at the location of a sensor.

A disadvantage of prior art arrangements may lie in possible constraints (e.g., in terms of wire sections, wire bonding complexity, possible presence of mixed wires) related to the leads in the lead frame being used both for signal transmission and for power supply.

Such constraints may result in fairly complex arrangements in the lead frame and the associated wire bonding layout which provides electrical connection between the lead frame and the semiconductor die or chip.

BRIEF SUMMARY

One or more embodiments may relate to a corresponding electrical circuit as well as to a corresponding method.

One or more embodiments may be applied to semiconductor packages or products that include at least one semiconductor die having integrated circuits.

The claims are an integral part of the technical teaching provided herein in respect of the invention.

In one or more embodiments signal transmission and power supply can be separated, providing, e.g., one or more of the following advantages:

- power bars can be removed from the lead frame with power supply taking place at a central area of the die,
- lead frame structure and wire bonding layout are simplified,
- various constraints on power supply (wire sections, wire bonding complexity, mixed wires) can be loosened and possibly eliminated.

One or more embodiments may contemplate using pads on a molded package body for power supply purposes, while transmission of signals takes place via the leads in the lead frame.

One or more embodiments make it possible to remove power bars from semiconductor devices such as Quad Flat Pack (QFP) devices, while power supply may take place from the central portion of the semiconductor die.

This may result in a simple, easy-to-produce lead frame with a corresponding reduction of manufacturing complexity and cost. Such advantages may also extend to the associated wire bonding layout.

BRIEF DESCRIPTION OF THE SEVERAL VIEWS OF THE DRAWINGS

One or more embodiments will now be described, by way of example only, with reference to the annexed figures, wherein.

It will be appreciated that, for the sake of clarity and ease of representation, the various figures may not be drawn to a same scale.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
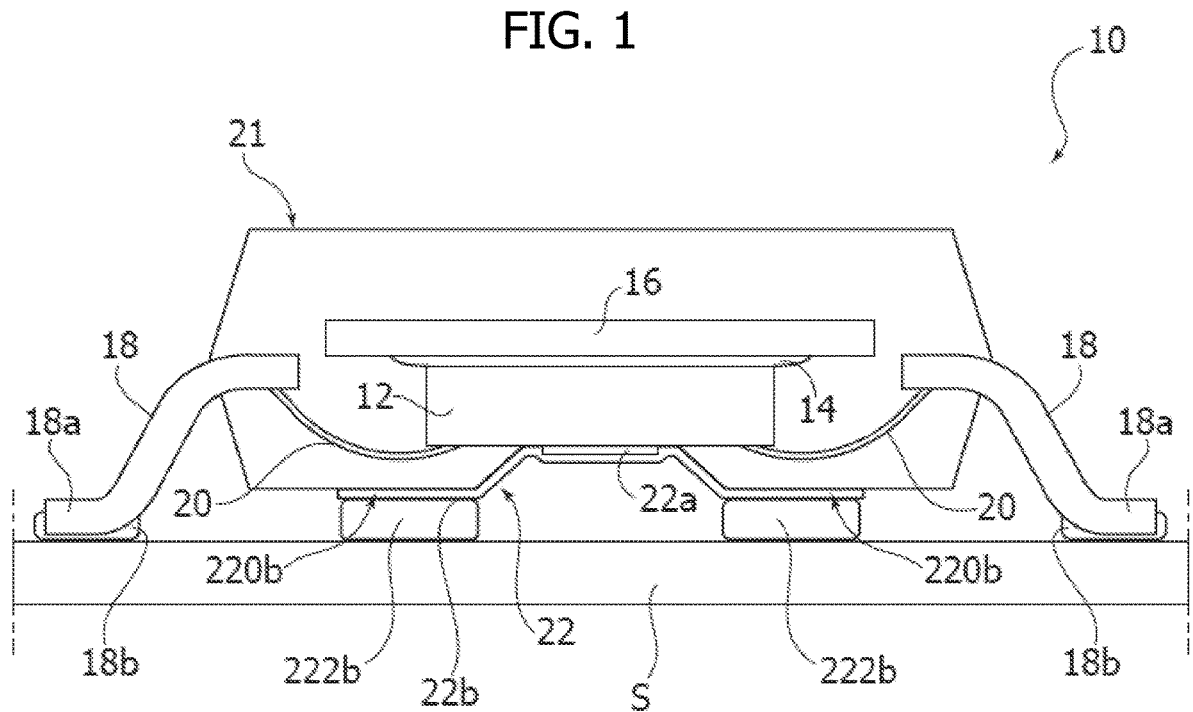
FIG. 1 is a cross-sectional view of a semiconductor device or package according to one embodiment, FIGS. 2(*a*) through 2(*f*) illustrate the semiconductor device of FIG. 1 at various stages of manufacturing in accordance with one embodiment.

In FIG. 1, reference 10 indicates a semiconductor device (or package), that includes a semiconductor die or chip 12 having an active surface that includes one or more integrated circuits (IC). A semiconductor device of the Quad Flat Pack (QFP) type may be exemplary of such a semiconductor device.

The semiconductor device 10 as exemplified in FIG. 1 includes the semiconductor die or chip 12 attached (e.g., via a die attach layer 14) to a die pad 16 surrounded by an array of leads 18 in a lead frame arrangement. The exemplary device 10 of FIG. 1 includes a wire bonding layout of wires 20 providing electrical coupling between wire bonding pads at the (lower, in FIG. 1) surface of the die or chip 12 and the leads 18 in the lead frame. The device 10 as exemplified in FIG. 1 also includes a package body 21 of, e.g., an electrically insulating package molding compound (PMC) molded on the die 12, wires 20, and portions of the leads 18.

Other than for the various points discussed in the following, such an arrangement of parts is conventional in the art, thus making it unnecessary to provide a more detailed description herein.

In one or more embodiments, the leads 18 in the lead frame (and the wire bonding layout exemplified by the wires 20) are used for transmission of signals to and/or from the semiconductor chip or die 12. To that effect, the leads 18 include distal portions 18a extending away from the package body 21 and adapted to be coupled (e.g., via soldering or other conventional electrical/mechanical connection techniques) to corresponding (e.g., soldering) pads 18b as provided on a substrate S. A printed circuit board (PCB) may be exemplary of such a substrate S.

In one or more embodiments, a power supply connection (e.g., power supply lines) for the semiconductor chip or die 12 may be provided via electrically-conductive pads arranged at a central portion of the device 10.

In one or more embodiments, such a power supply connection, indicated as 22 as a whole, may include one or more layers of electrically conductive material 22a (e.g., metal such as a Copper (Cu) ReDistribution Layer (RDL)) at the active (lower, in FIG. 1) surface of the semiconductor chip or die 12 as well an electrically-conductive metallization layer (e.g., silver) 22b extending between the conductive material 22a at the semiconductor chip or die and the outer surface of the package body 21.

As exemplified in FIG. 1, the electrically conductive material 22a may extend over the surface of the semiconductor die or chip 12 at a recessed position with respect to the outer profile of the package body 21, with the metallization layer 22b including distal portions 220b at the surface of the package body 21 at a position exposed to the substrate S, thus making it possible to provide electrical connection, e.g., via soldering masses 222b (or other conventional techniques known for that purpose) to a power supply (not visible in the figures) at the substrate S.

In one or more embodiments as exemplified in FIG. 1, the semiconductor chip or die 12 will be arranged, so-to-say, "upside down", that is with the active surface of the semiconductor die or chip 12 at which the wire bonding layout wires 20 are coupled facing "downwards", that is towards the substrate S.

In one or more embodiments as exemplified in FIG. 1, the (central) power supply connection 22 will be arranged at the same surface again facing towards the substrate S, optionally exposed (e.g., at a recessed position) at the outer surface of the package body 21 thus being left uncovered by the package body 21.

FIGS. 2(a) through 2(f) are exemplary of possible (optionally sequential) acts in manufacturing the semiconductor device 10 of FIG. 1.

FIG. 2(a) is exemplary of the act of attaching a die or chip 12 (e.g., via a die attach layer 14) on a die pad 16 of a lead frame strip 16, 18 while also providing the wire bonding layout 20 for signal transmission between the leads 18 in the lead frame and the die pads at the active (here upper) surface of the semiconductor die or chip 12.

FIG. 2(a) is also exemplary of the provision of the electrically conductive material 22a arranged centrally (e.g., Cu RDL) at the active surface.

FIG. 2(b) is exemplary of the formation (e.g., via film-assisted molding) of the package body 21 around the die or chip 12, the die pad 16, the wire bonding layout 20 and portions of the leads 18.

In one or more embodiments, the encapsulation by the package body 21 is carried out in such a way that the conductive material 22a of the die or chip 12 is left uncovered by the package body 21 so that the conductive material 22a remains exposed and thus accessible from the outside of the assembly thus formed. Thus, a recessed cavity is formed in the package body 21. The recessed cavity surrounds the electrically conductive material 22a.

FIG. 2(c) is exemplary of the formation of the metallization layer 22b (e.g., silver or other electrically-conductive materials, such as electrically conductive alloys) including a portion extending over the walls of the recessed cavity surrounding the conductive material 22a to make electrical contact therewith with a peripheral portion extending over the (here upper) surface of the package, e.g., plastic body 21, to form the distal portion 220b.

In one or more embodiments such act may involve printing a conductive layer, such as the metallization layer 22b, on the conductive material 22a and portions of the package body 21. The metallization layer 22b may be printed to have a thickness between 1 and 50 micron (1 micron=$10^{-6}$ m).

FIG. 2(d) is exemplary of certain possible steps including post-mold curing of the package body 21 (e.g., via the application of heat H) and sintering (e.g., 180-220 degrees Celsius) of the material (e.g., printed ink) providing the metallization 22b.

FIGS. 2(e) and 2(f) are also exemplary of further actions, such as a plating P of the distal portions 18a of the (signal carrying) leads 18, as well as trimming and forming steps, schematically indicated TF, leading to the completion of the semiconductor device 10 as exemplified in FIG. 1.

Figure 2:
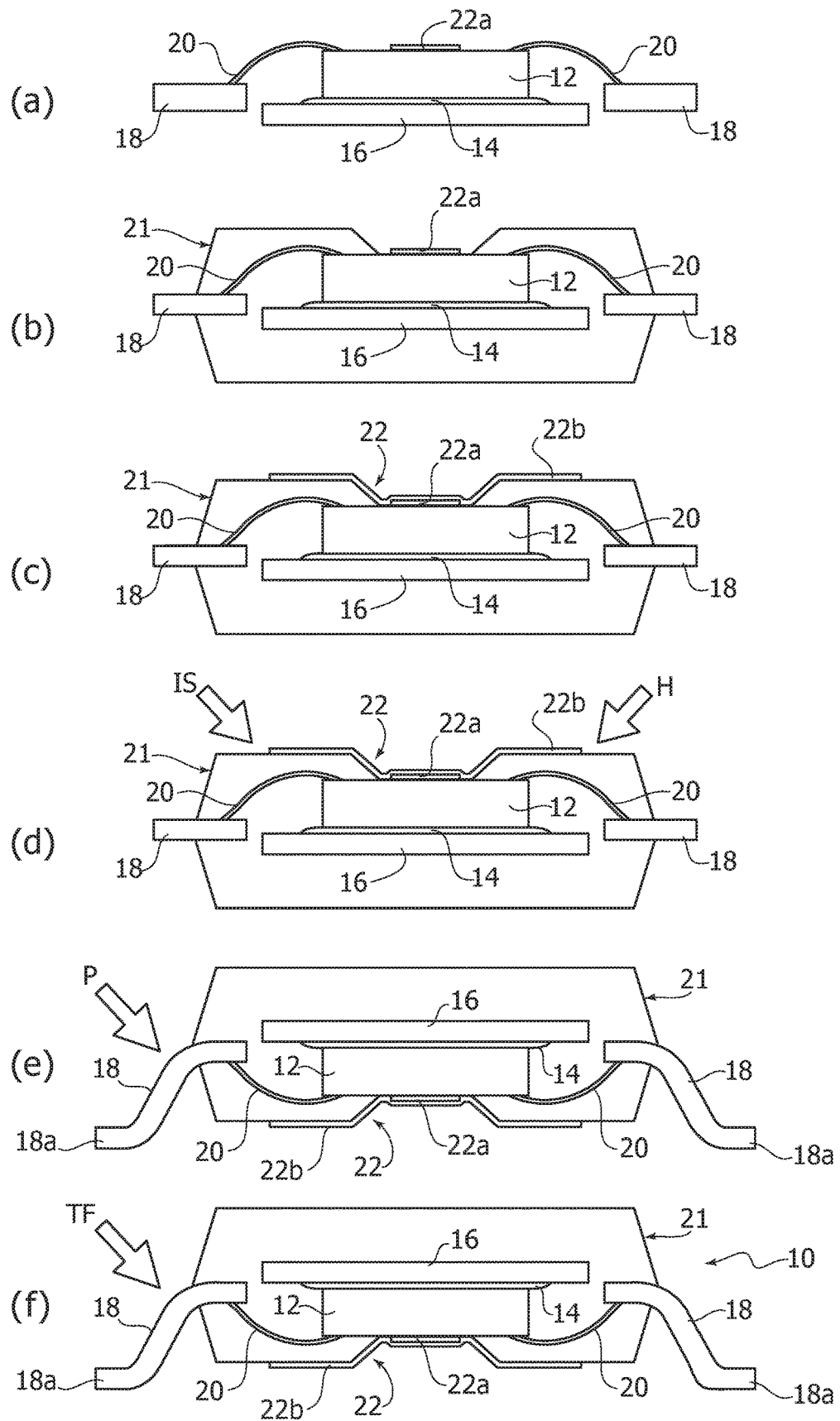

It will be appreciated that, while the representation of FIG. 2 refers for simplicity to a single package unit, the various acts discussed herein may in fact be performed (according to principles known per se) on a matrix-like array of items arranged, e.g., on a common lead frame. In that regard, trimming and forming steps involve separating other devices (or packages) from each other, Such a device is adapted to be used in a circuit including one or more such semiconductor devices 10 mounted on a substrate such as the substrate S of FIG. 1 with:

signal propagation to and from the semiconductor chip or die 12 facilitated by the (signal carrying) leads 18 in the lead frame around the chip or die 12, and power coupling (e.g., power supply of the semiconductor chip or die 12) facilitated via the (central) contact supply 22.

FIGS. 3, 4, 5 and 6 are exemplary of possible variants which can be adopted in one or more embodiments.

Throughout FIGS. 3, 4, 5 and 6 parts/elements like parts/elements already discussed in connection with FIGS. 1 and 2 are indicated with like numerals, thus making it unnecessary to provide a detailed description herein.

Figure 3:
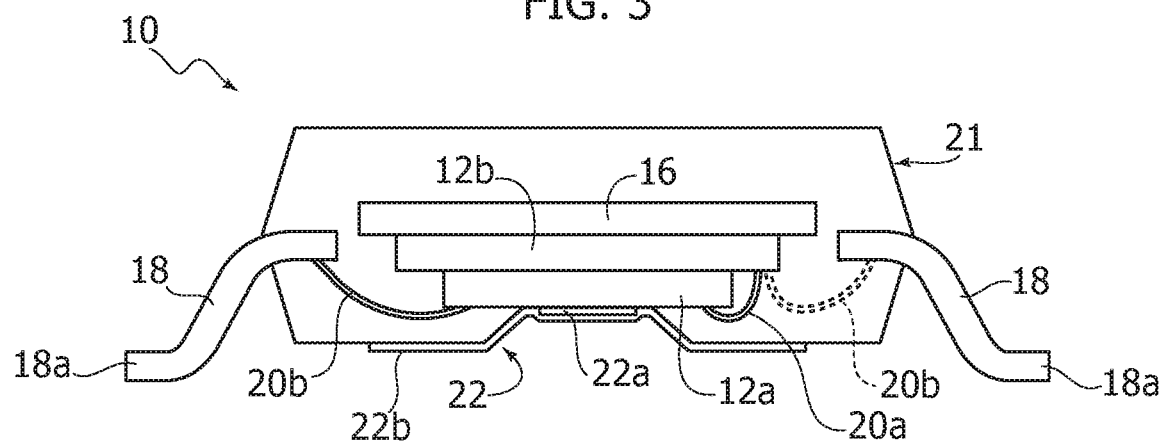
FIGS. 3, 4, 5, and 6 are exemplary of different embodiments of semiconductor devices or packages.

FIG. 3 is exemplary of embodiments including, in the place of a single semiconductor die or chip 12 as exemplified in FIGS. 1 and 2, a "stacked" arrangement including to superposed dice or chips 12a, 12b with associated wire bonding layouts 20a, 20b.

Figure 4:
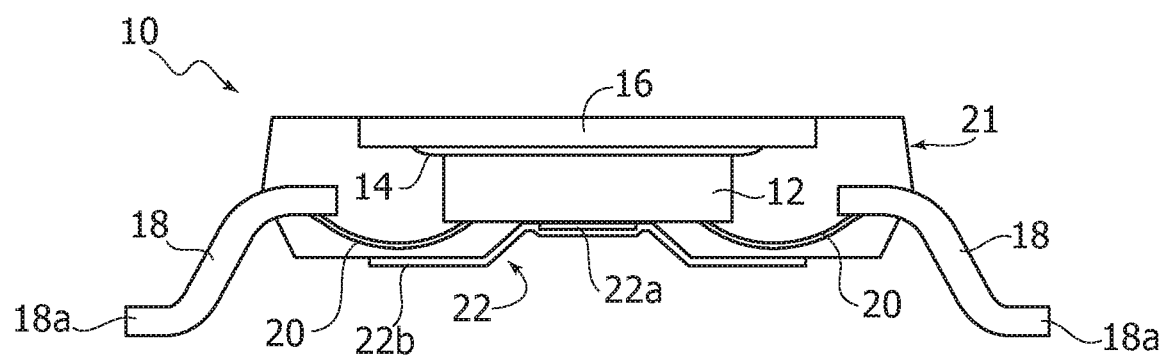

FIG. 4 is exemplary of embodiments where a surface of the die pad 18 is exposed at a side of the package body 21 that is opposite to the side where the power supply 22 is provided.

Figure 5:
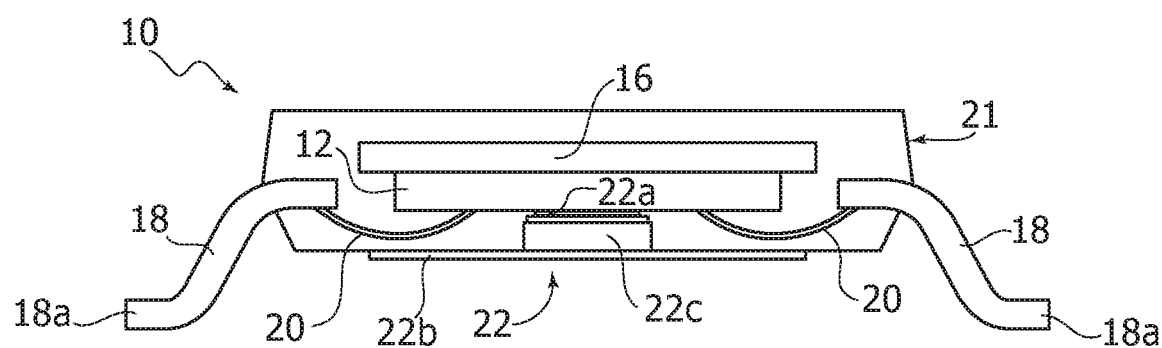

FIG. 5 is exemplary of embodiments where no recessed portion of the package 21 is provided at the location of the power supply 22. In that case, an electrically/thermally conductive insert 22c (e.g., metal such as copper) can be provided between the conductive material 22a and the metallization 22b, with the metallization 22b extending as a substantially flat element over the un-recessed surface of the package body 21.

Figure 6:
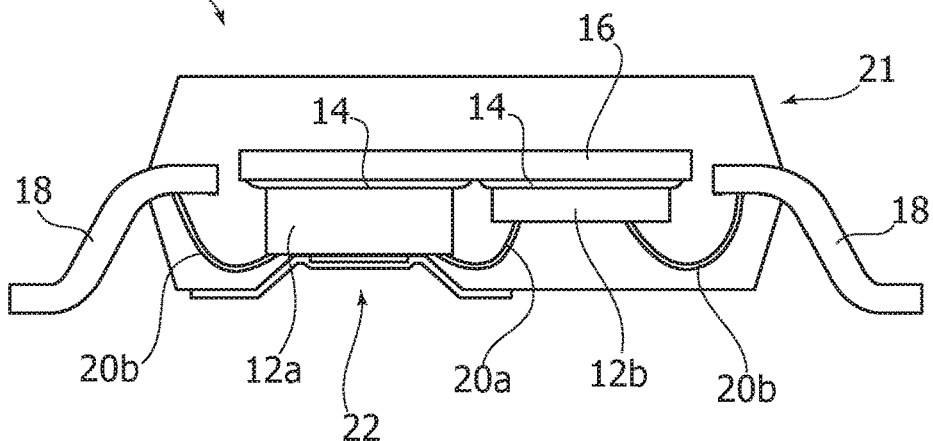

FIG. 6 is exemplary of embodiments again including, in the place of a single semiconductor die or chip 12 as exemplified in FIGS. 1 and 2, a "side-by-side" arrangement of, e.g., two dice or chips 12a, 12b with associated wire bonding layouts 20a, 20b, possibly with a (single) power supply 22 arranged centrally of one of the dice or chips 12a, 12b, e.g., die 12a.

It will be appreciated that features and elements exemplified in any one of the FIGS. 1 to 6 can be applied (singly or in combination) also to embodiments exemplified in other features.

Figure 7:
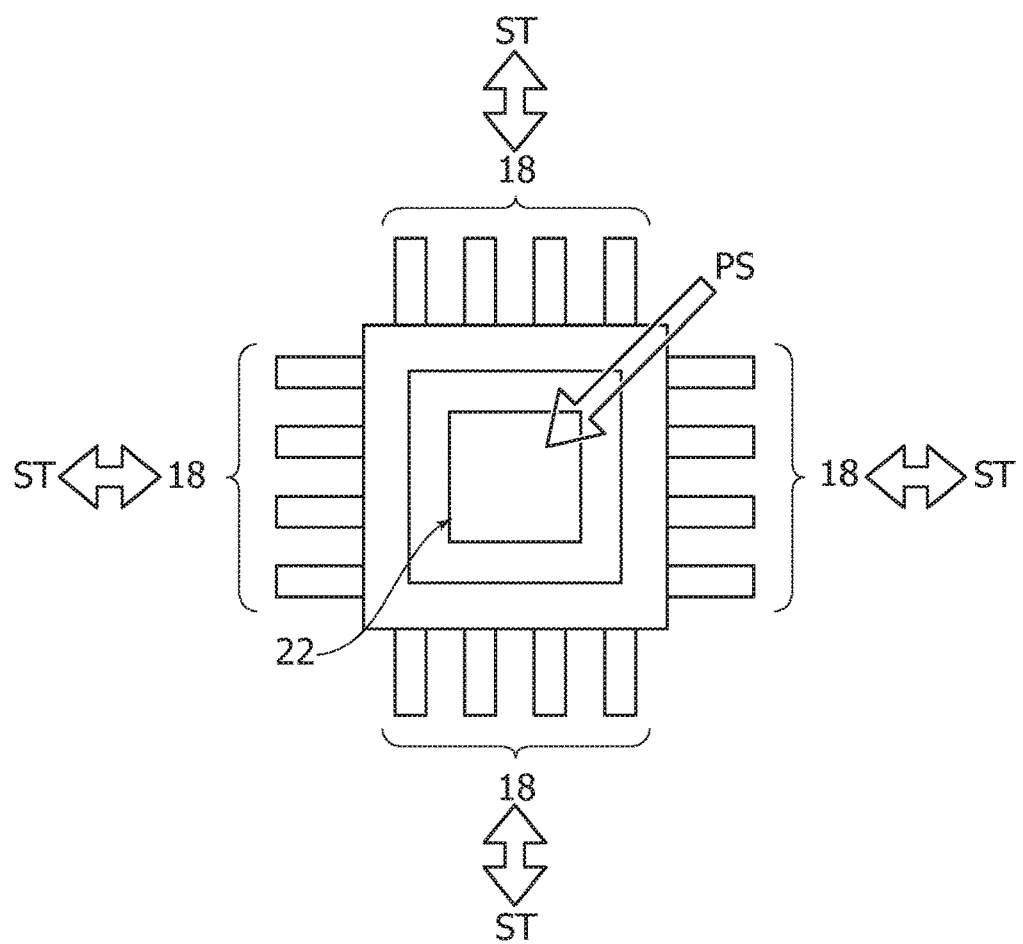
FIG. 7 is a plan view of at least one embodiment of a semiconductor device or package, such as the embodiment of FIG. 1.

One or more embodiments as exemplified herein may benefit from the general concept outlined in the plan view of FIG. 7, namely:

the (peripheral) leads 18 of the lead frame dedicated to signal transmission ST with respect to the semiconductor die or a chip 12, and power supply PS facilitated by the (central) connection 22.

As exemplified in FIG. 3, one or more arrangements as exemplified herein may be extended to include a plurality of semiconductor chips or dice 12a, 12b with associated signal carrying lead frame leads 18 and a central power connection 22.

In one or more embodiments, a device (e.g., 10) may include:

at least one semiconductor die (e.g., 12; 12a, 12b), a lead frame including an array of signal-carrying leads (e.g., 18) electrically coupled to the semiconductor die (e.g., 20), and a power supply connection (e.g., 22) for the at least one semiconductor die arranged centrally thereof.

In one or more embodiments, the power supply connection may include an inner electrically-conductive layer (e.g., 22a) extending over a surface of the semiconductor die.

One or more embodiments may include a device package (e.g., 21) encapsulating the semiconductor die, wherein the power supply connection includes an outer electrically-conductive layer (e.g., 22b) extending over a surface of the device package.

One or more embodiments may include a device package encapsulating the semiconductor die wherein the device package includes a recessed portion at the semiconductor die, the power supply connection extending in the recessed portion, optionally with an outer electrically-conductive layer extending into the recessed portion.

In one or more embodiments the device package may include a flat portion at the semiconductor die, the outer electrically-conductive layer extending at a distance to the semiconductor die, the power supply connection including an intermediate electrically-conductive body (e.g., 22c) between the inner layer and the outer layer.

One or more embodiments may include a die pad (e.g., 16) having the semiconductor die attached thereon, the die pad arranged opposite the power supply connection.

In one or more embodiments, the die pad may be exposed at the outer surface of the device package.

In one or more embodiments, an electrical circuit may include:

a substrate (e.g., S) including electrically-conductive signal (e.g., 18b) and power supply (e.g., 222b) formations, at least one device according to one or more embodiments mounted on the substrate with the signal-carrying leads and the power supply connection electrically coupled with said electrically-conductive signal and power supply formations of the substrate, respectively.

In one or more embodiments the power supply connection may be arranged facing the substrate.

In one or more embodiments, a method of mounting at least one device according to one or more embodiments onto a substrate including electrically-conductive signal and power supply formations may include arranging the device with the signal carrying leads in the lead frame and the power supply connection electrically coupled with the signal and the power supply formations, respectively, by arranging the power supply connection facing the substrate.

Without prejudice to the underlying principles, the details and embodiments may vary, even significantly with respect to what has been described by way of example only, without departing from the extent of protection.

The various embodiments described above can be combined to provide further embodiments. These and other changes can be made to the embodiments in light of the above-detailed description. In general, in the following claims, the terms used should be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
 a semiconductor die having an active surface;
 a lead frame including an array of leads electrically coupled to the semiconductor die;
 a power supply connection that is concentric with the active surface of the semiconductor die; and
 a package body, wherein the package body includes a recess at the semiconductor die that exposes the power supply connection,
 wherein the power supply connection includes a conductive layer on walls of the recess and on an outermost portion of the package body, wherein the conductive layer on the outermost portion of the package body includes solder receiving surfaces on at least two sides of the recess, wherein a remaining portion of the recess in the package body remains open.

2. The device of claim 1 wherein the power supply connection includes an inner electrically-conductive layer on a surface of the semiconductor die.

3. The device of claim 1, further comprising a die pad, the semiconductor die coupled to the die pad, wherein the die pad is arranged opposite the power supply connection.

4. The device of claim 3, wherein a surface of the die pad is exposed from the package body.

5. A system, comprising:
 a substrate including electrically-conductive pads and power supply formations; and
 wherein the device according to claim 1 is coupled to the substrate, the power supply connection electrically coupled with the electrically-conductive pads and power supply formations of the substrate, respectively.

6. The system of claim 5, wherein the power supply connection faces the substrate.

7. The device of claim 1, further comprising a substrate, and wherein the conductive layer and at least one lead of the array of leads are coupled to the substrate by solder material.

8. A method, comprising:
 coupling a semiconductor die to a die pad, the semiconductor die including an active surface and a conductive pad that is concentric with the active surface, the conductive pad being configured to provide a power supply connection for the semiconductor die
electrically coupling the semiconductor die to leads;
forming a package body around the semiconductor die and portions of the leads, wherein the conductive pad remains completely uncovered by the package body at a recess in the package body; and
forming a conductive layer on the conductive pad, walls of the recess, and on an outermost portion of the package body, wherein the conductive layer on the outermost portion of the package body includes solder receiving surfaces on opposing sides of the recess, wherein a remaining portion of the recess in the package body remains open.

9. The method of claim 8 wherein the package body includes the recess around the conductive pad, wherein forming the conductive layer includes printing the conductive layer on walls of the recess.

10. The method of claim 8, further comprising coupling the leads and the conductive layer to a printed circuit board.

11. The method of claim 8 wherein forming the conductive layer on the conductive pad and a portion of the package body comprises printing the conductive layer on the conductive pad and the portion of the package body.

12. A semiconductor package, comprising:
a semiconductor die having an active surface including a conductive pad at a central portion of the active surface, the conductive pad configured to provide a power supply connection for the semiconductor die;
a die pad, the semiconductor die coupled to the die pad, the active surface of the semiconductor die facing away from the die pad;
a plurality of leads electrically coupled to the semiconductor die;
a package body around the semiconductor die and the die pad, wherein the conductive pad at the central portion of the active surface is exposed from the package body by a recess in the package body; and
a conductive layer on the conductive pad and on the package body in the recess, wherein the conductive layer has a portion that extends onto an outermost surface of the package body that is beyond the recess and includes solder receiving surfaces on at least two sides of the recess, wherein a remaining portion of the recess remains open.

13. The semiconductor package of claim 12 wherein a surface of the die pad is exposed from the package body, wherein the surface of the die pad that is exposed from the package body is opposite the active surface of the semiconductor die.

14. The semiconductor package of claim 12 wherein the semiconductor die is a first semiconductor die, the semiconductor package further comprising a second semiconductor die between the first semiconductor die and the die pad.

15. The semiconductor package of claim 12 wherein the conductive layer is on the conductive pad, walls of the recess of the package body, and a planar surface of the package body.

16. The semiconductor package of claim 12, the conductive layer having a surface that is coplanar with a surface of the package body.

17. A semiconductor package comprising:
a semiconductor die having an active surface including a conductive pad at a central portion of the active surface, the conductive pad configured to provide a power supply connection for the semiconductor die;
a die pad, the semiconductor die coupled to the die pad, the active surface of the semiconductor die facing away from the die pad;
a plurality of leads electrically coupled to the semiconductor die;
a package body around the semiconductor die and the die pad, wherein the conductive pad at the central portion of the active surface is exposed from the package body by a recess in the package body; and
a conductive layer on the conductive pad and on the package body in the recess, wherein the conductive layer has a portion that extends onto an outermost surface of the package body that is beyond the recess, wherein a remaining portion of the recess remains open,
wherein the semiconductor package is electrically coupled to a printed circuit board by solder located between the plurality of leads and the printed circuit board and by solder between the portion of the conductive layer that extends onto the outermost surface of the package body and the printed circuit board.

* * * * *